United States Patent [19]

York

[11] 4,434,401

[45] Feb. 28, 1984

[54] APPARATUS FOR TESTING SEMICONDUCTOR DEVICES AND CAPACITORS

[75] Inventor: Robert A. York, Mechanicsburg, Pa.

[73] Assignee: Flight Systems, Inc., Mechanicsburg, Pa.

[21] Appl. No.: 260,467

[22] Filed: May 4, 1981

[51] Int. Cl.³ ............................................. G01R 31/02
[52] U.S. Cl. ................................. 324/158 SC; 324/51
[58] Field of Search ........ 324/158 SC, 158 T, 158 D, 324/51

[56] References Cited

U.S. PATENT DOCUMENTS

| | | | |
|---|---|---|---|
| 3,193,766 | 7/1965 | Fleming | 324/158 |
| 3,206,675 | 9/1965 | Brunetto | 324/158 |
| 3,277,371 | 10/1966 | Marcus et al. | 324/158 |
| 3,478,264 | 11/1969 | Tsergas | 324/51 X |
| 3,914,690 | 10/1975 | Shelnutt | 324/158 SC X |
| 4,031,465 | 6/1977 | Sterner | 324/158 SC |

FOREIGN PATENT DOCUMENTS 956913  4/1964  United Kingdom .................. 324/51

OTHER PUBLICATIONS

Carlson: "Semiconductor Circuit Tester . . . "-Radio Electronics-vol. 36-No. 4-Apr. 1965, p. 70.
Phillips Catalogue: "Test and Measuring Instruments'-'-1971-pp. 139-141.
International Rectifier News: "Testing Controlled Rectifiers", part 2, 1966.

Primary Examiner—Stanley T. Krawczewicz
Assistant Examiner—Jose M. Solis
Attorney, Agent, or Firm—Seidel, Gonda & Goldhammer

[57] ABSTRACT

An apparatus is provided for testing semiconductor devices. The apparatus tests the impedance of the semiconductor devices in both conducting and non-conducting states to detect semiconductors whose impedance in the conducting state is too high or whose impedance in the non-conducting state is too low. The apparatus uses a battery source for low voltage d.c. The circuitry for detecting when the impedance is too high in the conducting state includes a lamp in series with the battery source and the semiconductor device, whereby the impedance of the semiconductor device determines whether sufficient current will flow through the lamp to cause the lamp to illuminate. A d.c. to d.c. converter is provided to boost the voltage from the battery source to a relatively high voltage d.c. The relatively high voltage d.c. can be connected by a switch to circuitry for detecting when the impedance of the semiconductor device in the non-conducting state is too low. The circuitry for detecting when the impedance of the semiconductor device is too low includes a resistor which senses the current flowing in the device and converts the current into a voltage proportional to the leakage current. This voltage is then compared against a fixed reference. Further circuitry is provided for providing a visual indication when the voltage representative of leakage in relation to the reference signal indicates that there is excessive current flow through the semiconductor device.

16 Claims, 3 Drawing Figures

APPARATUS FOR TESTING SEMICONDUCTOR DEVICES AND CAPACITORS

BACKGROUND

This invention is related to testing devices primarily intended for testing semiconductor devices such as transistors, diodes, controlled rectifiers and triacs. Semiconductors of this type act generally as "switches", that is, they normally exhibit two states: a high impedance or "non-conducting" state, and a low impedance or "conducting" state. Devices for testing these semiconductors therefore normally test internal impedance to determine if the impedance is proper for the state the device is expected to exhibit.

Such devices often have detachable alligator connectors or probes to make electrical connections with the terminals of the semiconductors. A test voltage is applied across the semiconductor through the connectors or probes. Diodes can be connected with the positive polarity (higher voltage) to the anode and the negative (ground) to the cathode, in which case the diode should exhibit a low impedance or conducting state. Alternatively, the terminals can be reversed, with the anode connected to ground and the cathode to the positive voltage, in which case the diode should exhibit a high impedance. If the diode has a lower reverse impedance than is normally expected, "leakage" current will pass through the diode. SCRs and triacs normally exhibit a high impedance until a positive voltage is supplied to their gate terminal, in which case they exhibit a low impedance. Also, when the gate voltage is removed, these devices should remain in a low impedance state until the voltage across the device drops to nearly zero. If SCRs and triacs do not exhibit these characteristics, they are defective. Thus, a test device should be capable of testing for the characteristics discussed above.

Many semiconductor devices, including breakdown devices, are intended to operate at relatively high voltages (in excess of 200 volts d.c.). Testing for leakage at low voltages often gives misleading results, as the semiconductor may test satisfactorily at low voltage and yet exhibit excessive leakage when subjected to operational voltages. Portable test units employing batteries normally only test at low voltage.

It is an object of the present invention to provide a portable testing device which is capable of testing the semiconductors at both high and low voltage levels.

It is another object of the present invention to provide for the use of a conventional voltmeter in conjunction with the testing device in order to read exact voltages across the semiconductor.

A further objective of the present invention is to provide a semiconductor testing device that can also be used to test capacitors.

These and other objectives of the present invention will become apparent upon reading the detailed disclosure which follows:

BRIEF SUMMARY OF THE INVENTION

An apparatus is provided for testing semiconductor devices. The apparatus tests the impedance of the semiconductor devices in both conducting and non-conducting states to detect semiconductors whose impedance in the conducting state is too high or whose impedance in the non-conducting state is too low. The apparatus uses a battery source for low voltage d.c. The circuitry for detecting when the impedance is too high in the conducting state includes a lamp in series with the battery source and the semiconductor device, whereby the impedance of the semiconductor device determines whether sufficient current will flow through the lamp to cause the lamp to illuminate. A d.c. to d.c. converter is provided to boost the voltage from the battery source to a relatively high voltage d.c. The relatively high voltage d.c. can be connected by a switch to circuitry for detecting when the impedance of the semiconductor device in the non-conducting state is too low. Current flowing in the device under test is compared to a fixed reference in a comparator circuit. If the current flowing in the device under test exceeds a fixed reference, a visual indication of excessive leakage is provided.

BRIEF DESCRIPTION OF THE DRAWINGS

For the purpose of illustrating the invention, there is shown in the drawings a form which is presently preferred; it being understood, however, that this invention is not limited to the precise arrangements and instrumentalities shown.

DETAILED DESCRIPTION OF THE DISCLOSURE

Figure 1:
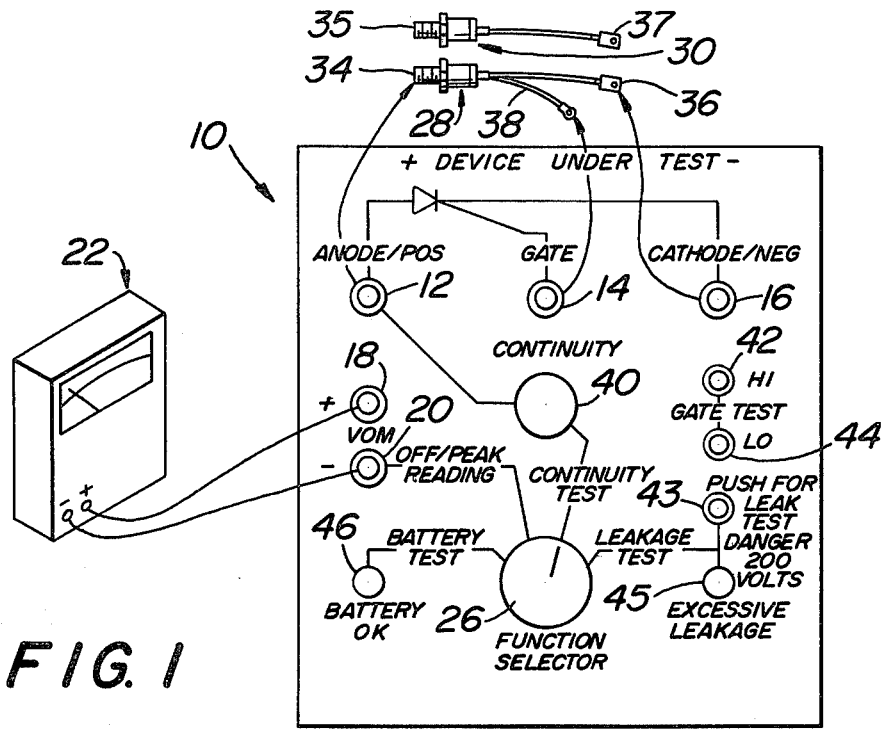
FIG. 1 is a symbolic representation of a testing device in accordance with the present invention, set to test the continuity of a circuit including a semiconductor device.
Figure 2:
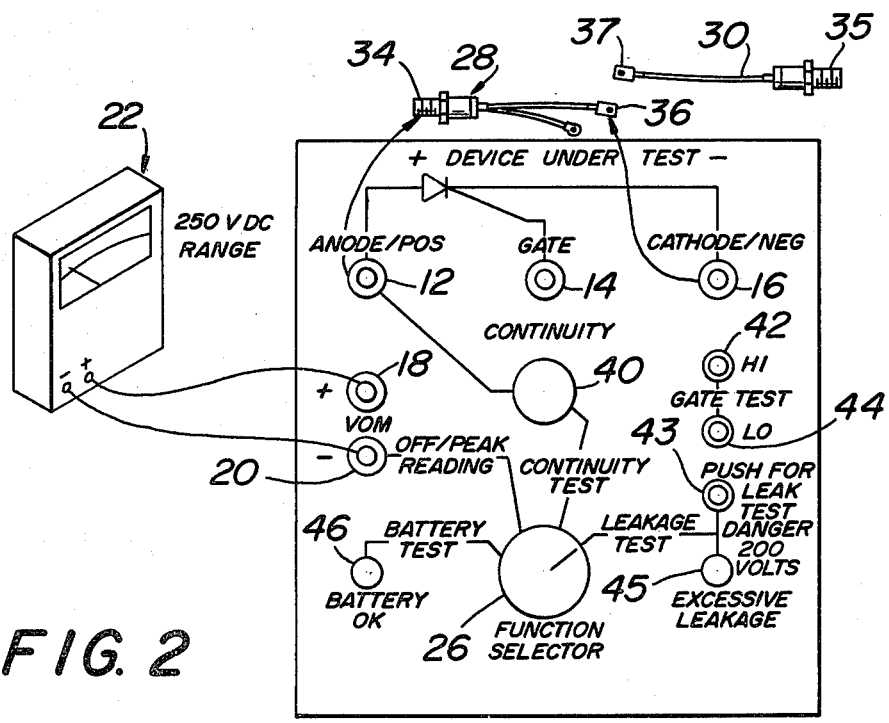
FIG. 2 is a symbolic representation of a test device in accordance with the present invention, set to test for leakage through a semiconductor.

Referring now to the drawings, wherein like numerals indicate like elements, there is shown in FIGS. 1 and 2 a control panel 10 of a test apparatus for testing semiconductors and capacitors. Three jack receptacles 12, 14 and 16 are provided to receive terminal jacks of wires connecting the test apparatus to the semiconductor or capacitor to be tested. Receptacle 12 is labeled "ANODE/POS", indicating that a positive voltage is available at receptacle 12. Receptacle 16 is labeled "CATHODE/NEG", indicating that receptacle 16 is connected to electrical ground. Receptacle 14 is labeled "GATE" indicating that a positive voltage is available at receptacle 14 for switching on the gate of an SCR or a triac, or the base of an NPN transistor.

Two additional jack receptacles 18 and 20 are provided. The legend "VOM" appears between receptacles 18 and 20, indicating that they are receptacles for connecting a voltmeter 22 to operate in conjunction with the test device. Polarity signs are provided adjacent to receptacles 18 and 20, and indicate that receptacle 18 is the positive (+) receptacle and that receptacle 20 is the negative (−) receptacle.

A function selector switch 26 is used to select the type of test to be performed by the apparatus. Switch 26 has four positions, labeled respectively: "BATTERY TEST", "OFF/PEAK READING", "CONTINUITY TEST" and "LEAKAGE TEST". In FIG. 1, switch 26 is in the "CONTINUITY TEST" position, indicating that the test apparatus is set up to test the continuity of a circuit containing a semiconductor device. Two such devices are shown in FIG. 1, an SCR 28 and a power diode 30. For testing, the anode 34 of SCR 28 is connected to receptacle 12, the cathode 36 is connected to receptacle 16, and the gate 38 is connected to receptacle 14. Diode 30 could be similarly connected, except that there would be no gate terminal.

With SCR 28 so connected, placing function selector switch 26 in the "CONTINUITY TEST" position connects an internal battery to "ANODE/POS" receptacle 12 by way of a series connection through continuity indicator lamp 40. It can be seen that a path to ground is thereby provided, comprising receptacle 12 to the anode 34 of SCR 28 and across SCR 28 to cathode 36 and then to ground at receptacle 16. Since SCR 28 is expected to exhibit a high impedance in the absence of a positive voltage at the gate 38, a very low current (essentially zero) should flow through continuity indicator lamp 40, and lamp 40 will not be illuminated.

To test SCR 28 in its conducting mode, a firing signal must be supplied to gate terminal 38. Two press-down switches 42 and 44 are provided for this purpose. Switches 42 and 44 are labeled "HI" and "LO" respectively and bear the legend "GATE TEST" between them. Depressing switch 42 provides a relatively high current pulse signal to receptacle 14, and switch 44 provides a relatively low current pulse signal. Most SCRs can be gated on with the "LO" signal, but some larger SCRs may require the "HI" signal. Whichever is used, depressing one of switches 42 and 44 provides a firing signal to gate 38 and renders SCR 28 conductive, thus bringing on continuity lamp 40. If lamp 40 does not illuminate, it is an indication that SCR 28 is defective. (A transistor requiring a positive voltage at its base terminal to enter a conducting state can be tested in a similar manner).

Once switched on by a firing signal, SCR 28 will remain on even after switches 42 or 44 are released, since there is a positive differential between the anode and cathode. To check the turn off of SCR 28, function selector switch 26 is moved to the "OFF/PEAK READING" position. This removes battery voltage from receptacle 12 and thus from anode 34, and causes SCR 28 to return to a non-conducting state, causing lamp 40 to extinguish. When switch 26 is returned to the "CONTINUITY TEST" position, lamp 40 should remain extinguished.

If diode 30 were being tested, its anode 35 would be connected to receptacle 12 and its cathode 37 would be connected to ground through receptacle 16. For a normally functioning diode, the continuity lamp 40 should illuminate. If it does not, diode 30 may be defective in that there is an abnormally high impedance (open circuit) across its junction.

In FIG. 2, the test apparatus is set to test for current leakage through the semiconductor. Function selector switch 26 is in the "LEAKAGE TEST" position. SCR 28 is connected as described above, with anode 34 connected to receptacle 12 and cathode 36 connected to receptacle 16. Gate 38 need not be connected to receptacle 14. SCR 28 should thus be in a non-conducting state, since gate 38 has received no firing signal.

A push down switch 43 labeled "PUSH FOR LEAK TEST" is provided, and when depressed completes an electrical circuit which supplies a high voltage d.c. to the anode 34 of SCR 28. An indicator LED 45 labeled "EXCESSIVE LEAKAGE" is provided to give a visual indication of the actual leakage compared to a predetermined reference. Since SCR 28 is expected to exhibit a very high impedance, LED 45 should remain extinguished. If LED 45 comes on, its indicates that SCR 28 has excessive current leakage. (A transistor could be similarly tested in its non-conducting state, since no bias voltage is being supplied to its base terminal).

This leakage test mode may also be used to test a diode 30 in its reverse direction. For this purpose, cathode 37 is connected to jack 12 and anode 35 is connected to jack 16. Diode 30 is expected to display a high impedance to current in this direction, and therefore LED 45 is expected to remain extinguished. If LED 45 should illuminate, it indicates that there is not sufficient internal resistance in diode 37, or to rephrase the result, there is excessive leakage.

The fourth position of function selector 26 is labeled "BATTERY TEST". This position is used to test the condition of an internal battery pack. If the test is satisfactory, a lamp 46 labeled "BATTERY OK" illuminates.

Figure 3:
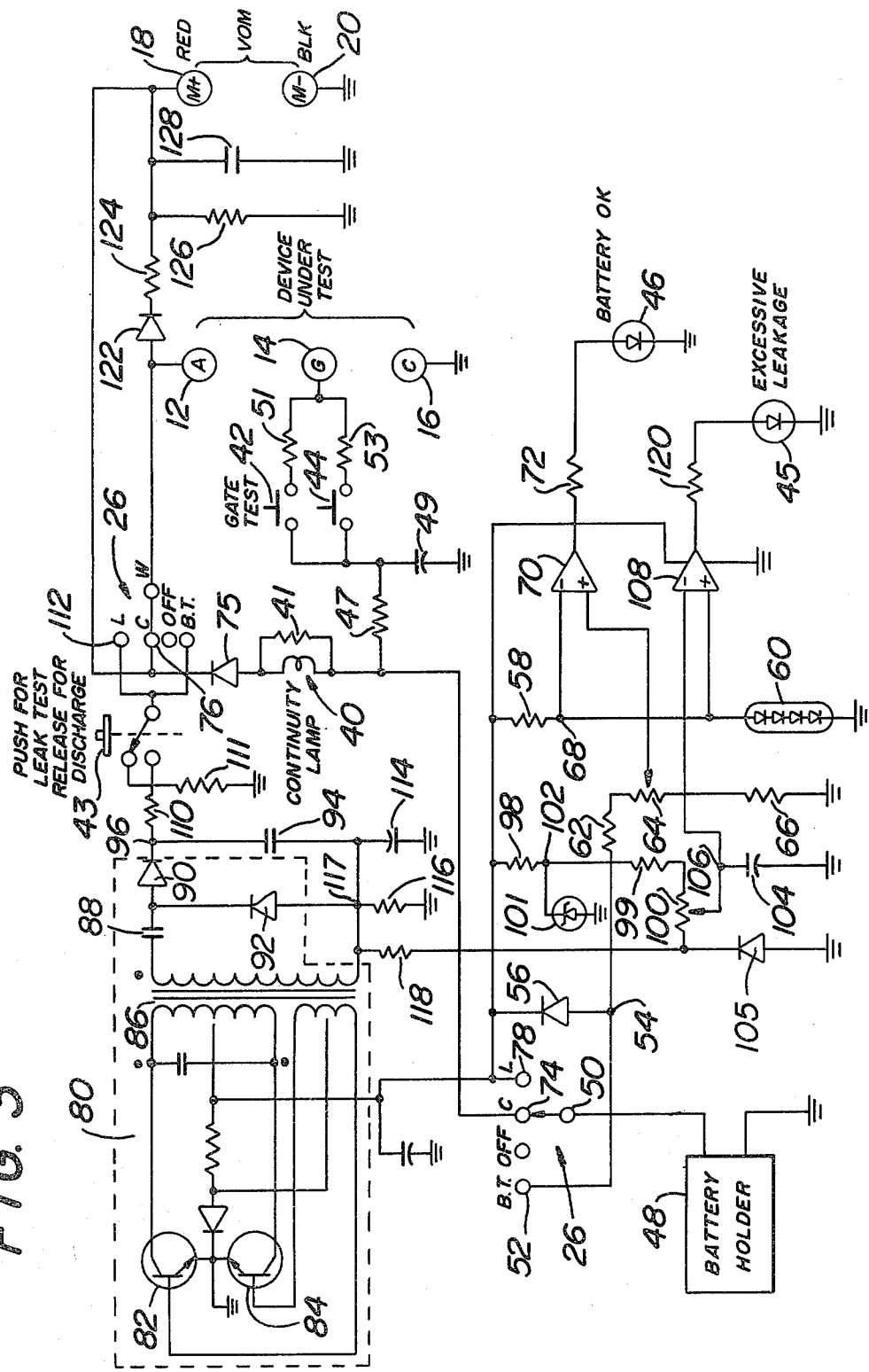
FIG. 3 is a schematic diagram of the circuitry of a test device according to the present invention.

Referring now to FIG. 3, there is shown a schematic diagram of the circuitry of the test apparatus. A battery holder 48 preferably holds four C cell batteries in series, thus supplying six volts d.c. to the common contact 50 of function selector switch 26 (note that function selector switch 26 also controls the contacts depicted in the upper central portion of FIG. 3). More than six volts could be used, but it is desirable to have a relatively low voltage for some tests, with 24 volts probably being about the highest desirable. If switch 26 is selected to contact 52, the circuitry for testing the battery is enabled. Battery voltage is applied through contact 52 to junction 54, and causes current to flow in two paths from junction 54 to ground. The first path is through diode 56, resistor 58 and diode array 60. Diode 56 supplies operating voltage to comparators 70 and 108 and supplies power to the DC—DC converter 80. The DC—DC converter 80 functions as a load for the batteries during battery testing to provide a realistic indication of battery strength. The second path is through resistor 62, potentiometer 64 and resistor 66. Potentiometer 64 provides an input representative of the battery voltage to comparator 70, where it is compared with a reference voltage at junction 68. Potentiometer 64 is pre-adjusted to preferably 5 volts. The output of comparator 70 is connected through current limiting resistor 72 to LED 46.

Diode array 60 clamps junction 68 at a constant voltage level. When the voltage at potentiometer 64 exceeds the voltage at junction 68, comparator 70 puts out a positive voltage, causing LED 46 to illuminate, indicating that the battery voltage is satisfactory. If the voltage at potentiometer 64 is less than that at junction 68, comparator 70 puts out a small voltage and LED 46 will remain off, indicating that battery voltage has dropped below the desired value.

When function selector 26 is selected to the "CONTINUITY TEST" position, the battery is connected through contact 74 to the continuity test circuitry. This circuitry comprises continuity lamp 40, resistor 41, diode 75, contact 76, and receptacle 12. When a semiconductor is connected to the test apparatus, the circuit is completed through the semiconductor to receptacle 16 and then to ground. If the impedance of the semiconductor is less than about 25 ohms, lamp 40 will illuminate. (It should be apparent that the continuity test circuitry can be used to test any circuit or circuit element for an impedance of about 25 ohms or less). In addition to providing a visual indication, lamp 40 and resistor 41 provide a variable load for testing SCR devices. The inrush current of lamp 40 permits the SCR under test to latch in the on state. As the filament of lamp 40 becomes hot, the resistance of the filament will increase and the current through the lamp decrease. The current through the filament of lamp 40 would decrease below the holding current for the SCR under test where it not for resistor R41, which provides a holding current load for the SCR. Resistor 47 provides a return for the current through the SCR under test, and the holding current is determined by the values of R47 and R41.

The continuity of a circuit containing a diode connected in forward polarity (conducting state) can be tested as set forth above. For a semiconductor device requiring a control signal to switch it to a conducting state, such as a transistor, SCR, or triac, the necessary control signal may be supplied through push-down switches 42 or 44. As explained previously, switch 42 provides a relatively high current to receptacle 14, and switch 44 provides a relatively low current to receptacle 14. Switches 42 and 44 are connected to the battery voltage through the continuity position (contact 74) of switch 26 and through a current limiting resistor 47. Capacitor 49 provides a stabilized voltage from the battery. When switch 42 is depressed, this voltage is connected through resistor 51 to receptacle 14. Similarly, when switch 44 is depressed battery voltage is connected through resistor 53 to receptacle 14. Resistor 53 is of a substantially higher resistance than resistor 51, preferably at least twice as large, with the result that a higher current is supplied through resistor 51 than through resistor 53. Most semiconductor devices can be adequately tested with low current by using switch 44, but a few large devices require a higher current as provided by switch 42.

When function selector switch 26 is selected to the "LEAKAGE TEST" position, the battery voltage is supplied through contact 78 to a d.c. to d.c. voltage converter 80. Converter 80 is a commonly used circuit for increasing d.c. voltages. Transistors 82 and 84 operate in conjunction with transformer 86 to create a flux oscillator, which inverts the d.c. signal to a bi-directional periodic waveform. The amplitude of this waveform is multiplied in the secondary of transformer 86 by the transformer gain, and is subsequently rectified by capacitor 88 in conjunction with diodes 90 and 92. Capacitor 88 and diodes 90, 92 act as a fullwave rectifier (voltage-doubler) for the signal in the secondary of transformer 86. The output of converter 80 is a rectified signal of approximately 200 volts applied to capacitor 94. This signal contains some ripple which is averaged and smoothed by capacitor 114.

In the "LEAKAGE TEST" mode, a device under test is connected between terminals 12 and 16. Current flows through resistor 110 and switch 43 through the device under test. Resistor 116 provides the return for this current. Thus, resistor 116 acts as a current sensor for the current flowing through the device under test. Accordingly, the voltage across resistor 116 is proportional to the leakage current flowing through the device under test. The voltage across resistor 116 is applied to comparator 108 through voltage divider composed of resistors 118 and potentiometer 100. The voltage is applied to the inverting input of comparator 108. Capacitor 104 is connected to the inverting input of comparator 108 to provide filtering. The voltage at node 102 is stabilized by zener diode 101. Diode 105 acts as a clamp to prevent the voltage from node 117 from going negative by more than one diode drop.

Comparator 108 is a measuring circuit. As already explained, the signal at the inverting input of comparator 108 is a voltage proportional to the leakage current flowing through the device under test. The signal applied to the non-inverting input of comparator 108 is a reference voltage derived from diode stack 60. Thus, if the voltage proportional to the leakage current through the device under test exceeds the reference voltage at the anode terminal of diode stack 60, the comparator will generate an output signal indicative of excessive leakage. The output signal will illuminate LED 45 to give a visual indication of excessive leakage.

This test apparatus may also be used to test the capacitance of a capacitor. The capacitor will have one plate connected to receptacle 12 and the other plate connected to receptacle 16. With switch 26 in the "LEAKAGE TEST" position, switch 43 is depressed. This allows current flow through the capacitor, and causes LED 45 to illuminate. As the capacitor under test charges, the current flow through the capacitor will decrease, eventually dropping to a value which will no longer cause comparator 108 to put out a positive signal, and LED 45 will extinguish. Thus, the capacitance of the capacitor under test is related to the amount of time necessary to extinguish LED 45, and a chart indicating capacitance versus time can easily be developed corresponding to the values of the circuit elements used in the test device. This chart can be checked against capacitors of known ratings for accuracy. As a safety feature, the released position of switch 43 connects terminal 112 to ground through resistor 111 so that the capacitor under test will discharge before it is disconnected.

Also shown on FIG. 3 are voltmeter receptacles 18 and 20. Receptacles 18 and 20 allow the voltmeter to measure voltage peaks of an ac voltage across the device under test. Diode 122, resistors 124 and 126 and capacitor 128 operate in conjunction to hold the peak voltage reading across the device under test for a sufficient time to allow the voltmeter to read peak values. Ordinarily, a VOM will read only the average value of an ac signal. The purpose of diode 122, resistors 124 and capacitor 128 is to allow a VOM of 20,000 ohms per volt or more to be connected across the VOM terminals of the tester. The VOM will now read the peak positive negative voltages of an alternating waveform applied across terminals A and C of the tester, instead of the average value of the waveform. This feature is useful for measuring the voltage peaks across the commutator capacitor for the power SCRs in an electric vehicle, for example. To perform this reading, switch 26 must be set to the OFF/PEAK READING position.

The present invention may be embodied in other specfic forms without departing from the spirit or essential attributes thereof and, accordingly, reference should be made to the appended claims, rather than to the foregoing specification.

I claim:
1. Apparatus for testing semiconductor devices in both the conducting and non-conducting states, comprising:
 (a) first circuit means for testing the continuity of a semiconductor device in a polarity in which the semiconductor device is normally conducting;
 (b) a battery source of direct current at a relatively low voltage of under approximately 24 volts, said relatively low voltage being applied to the first circuit means;

(c) means for providing a signal whenever the first means determines that the semiconductor device is in a conducting state;

(d) second circuit means for testing for leakage current flow through a semiconductor device connected in a polarity in which the semiconductor device is normally non-conducting;

(e) a dc to dc converter for boosting the relatively low voltage dc to a relatively high voltage dc of approximately 200 volts, said relatively high voltage dc being applied to the second circuit means;

(f) means for providing a signal whenever the second circuit means determines that there is excessive leakage current flow through the semiconductor device; and (g) switch means for selecting between the first circuit means and the second circuit means;

2. Apparatus as in claim 1, wherein the semiconductor device may be of a type in which a control signal determines whether the device is in a conducting state or a non-conducting state, further comprising circuitry for selectively applying said control signal to the semiconductor device during the test for continuity.

3. Apparatus as in claim 2, wherein the circuitry for selectively applying the control signal comprises two separate circuits, each controlled by an on/off switch in the circuit, the first of said circuits connecting the battery source through the "on" terminal of its respective switch to a resistor in series with a control signal terminal of the semiconductor device, and the second circuit connecting the battery source through the "on" terminals of its respective switch to a resistor having a resistance at least twice as high as the resistor in the first circuit, and in series with the control signal terminal of the semiconductor device, whereby either one of the two control signals of different amplitude may be selected.

4. Apparatus as in claims 1, 2 or 3 further comprising third circuit means for testing the voltage of the battery power source, and means for providing a signal when the third circuit means determines that the voltage has dropped below a predetermined minimum.

5. Apparatus for testing the impedance of semiconductor devices in both conducting and non-conducting states to detect semiconductors whose impedance in the conducting state is too high or whose impedance in the non-conducting state is too low, comprising: P1 (a) a battery source of less than approximately 24 volts;

(b) switch means for connecting the battery source to first circuit means for detecting when the impedance of a semiconductor device in the conducting state is too high;

(c) said first circuit means comprising a lamp in series with the battery and the semiconductor device, whereby the impedance of the semiconductor device determines whether sufficient current will flow through the lamp to cause the lamp to illuminate;

(d) switch means between the battery source and a dc to dc converter, said converter having the ability to boost the voltage from the battery to above approximately 200 volts;

(e) switch means for connecting the voltage from the dc to dc converter to second circuit means for detecting when the impedance of the semiconductor device in the non-conducting state is too low;

(f) said second circuit means comprising a resistor which senses the leakage current flowing through the semiconductor device under test and converts the leakage current to a voltage proportional to the leakage current, and comparator circuitry for comparing the voltage signal proportional to the leakage current to a fixed voltage reference signal; and (g) means for providing an indication of excessive leakage when the comparator circuitry indicates there is excessive leakage current flow through the semiconductor device under test.

6. Apparatus according to claims 1 or 5 including means for connecting a volt-ohmmeter to the apparatus, means for connecting a time varying voltage to the apparatus and means for enabling the volt-ohmmeter to measure the peak positive and negative values of the time varying voltage.

7. Apparatus as in claim 6 wherein said means for enabling the volt-ohmmeter to measure the peak positive and negative values of a time varying voltage includes a peak holding circuit comprising a diode in series with a resistor and capacitor connected in a low-pass filter configuration.

8. Apparatus for testing semiconductor devices for continuity and reverse leakage current, comprising (a) a low-voltage dc voltage source of under approximately 24 volts;

(b) first circuit means for testing continuity of the semiconductor device connected in series with the voltage source and in a polarity in which the device is normally conductive, said first circuit means including an incandescent lamp in series with the voltage source and the semiconductor device, whereby the impedance of the semiconductor device determines whether sufficient current will flow through the lamp to cause the lamp to illuminate to provide an indication that the semiconductor device is in a conducting state;

(c) a dc to dc converter for boosting the low voltage produced by the dc voltage source to a relatively high dc voltage of approximately 200 volts;

(d) second circuit means for testing reverse leakage current of the semiconductor device connected in series with the output of the dc to dc converter and in a polarity in which the semiconductor device is normally non-conductive, said second circuit means including a resistor which senses the reverse leakage current flowing through the semiconductor device and converts the reverse leakage current to a voltage proportional to the reverse leakage current, circuitry for comparing the voltage proportional to the reverse leakage current to a fixed reference voltage and means to provide an indication whether the voltage proportional to the reverse leakage current exceeds the fixed reference voltage; and (e) selector means for selecting between said first circuit means and said second circuit means.

9. Apparatus as in claim 8, wherein the semiconductor device may be of a type in which a control signal determines whether the device is in a conducting state or a non-conducting state, further comprising circuitry for selectively applying said control signal to the semiconductor device during the test for continuity.

10. Apparatus as in claims 8 or 9, wherein the low voltage dc voltage source comprises at least one battery.

11. Apparatus as in claim 10, further comprising third circuit means for testing the voltage of the battery, said third circuit means including means for providing an indication when the voltage has dropped below a predetermined minimum.

12. Apparatus according to claim 8, including means for connecting a volt-ohmmeter to the apparatus, means for connecting a time-varying voltage to the apparatus and means for enabling the volt-ohmmeter to measure the peak positive and negative values of the time varying voltage.

13. Apparatus as in claim 12, wherein the means for enabling the volt-ohmmeter to measure the peak positive and negative values of a time varying voltage includes a peak holding circuit comprising a diode in series with a resistor and capacitor connected in a low-pass filter configuration.

14. Apparatus as in claim 8, wherein the selector means is a switch.

15. Apparatus for testing semiconductor devices for continuity and reverse leakage current, including semiconductor devices of the type in which a control signal determines whether the device is in a conducting state or a non-conducting state, comprising:

(a) a low-voltage dc voltage source of under approximately 24 volts and comprising at least one battery;

(b) first circuit means for testing continuity of the semiconductor device connected in series with the voltage source and in a polarity in which the device is normally conductive, said first circuit means including an incandescent lamp in series with the voltage source and the semiconductor device, whereby the impedance of the semiconductor device determines whether sufficient current will flow through the lamp to cause the lamp to illuminate to provide an indication that the semiconductor device is in a conducting state;

(c) means for selectively applying said control signal to the semiconductor device during the test for continuity;

(d) a dc to dc converter for boosting the low voltage produced by the dc voltage source to a relatively high dc voltage of approximately 200 volts;

(e) second circuit means for testing reverse leakage current of the semiconductor device connected in series with the output of the dc to dc converter and in a polarity in which the semiconductor device is normally non-conductive, said second circuit means including a resistor which senses the reverse leakage current flowing through the semiconductor device and converts the reverse leakage current to a voltage proportional to the reverse leakage current, circuitry for comparing the voltage proportional to the reverse leakage current to a fixed reference voltage and means to provide an indication whether the voltage proportional to the reverse leakage current exceeds the fixed reference voltage;

(f) third circuit means for testing the voltage of the battery, said third circuit means including means for providing an indication when the voltage has dropped below a predetermined minimum;

(g) means for connecting a volt-ohmmeter to the apparatus;

(h) means for connecting a time-varying voltage to the apparatus;

(i) means for enabling the volt-ohmmeter to measure the peak positive and negative values of the time varying voltage, said means including a peak holding circuit comprising a diode in series with a resistor and capacitor connected in a low-pass filter configuration; and (j) selector means for selecting between an off condition and said first, second and third circuit means.

16. Apparatus as in claims 1, 4, 5, 8, 11 or 15, wherein the third circuit means comprises a load for the battery power source and comparator means for comparing the voltage drop across the load to a fixed reference voltage and for providing a signal when the voltage drop across the load is less than the fixed reference voltage.

* * * * *